United States Patent [19]

Vukasovic

[11] 4,455,597
[45] Jun. 19, 1984

[54] THYRISTOR MATRIX HAVING AT LEAST FOUR COLUMNS

[75] Inventor: Lovro Vukasovic, Erlangen, Fed. Rep. of Germany

[73] Assignee: Siemens Aktiengesellschaft, Berlin and Munich, Fed. Rep. of Germany

[21] Appl. No.: 376,571

[22] Filed: May 10, 1982

[30] Foreign Application Priority Data

Jun. 10, 1981 [DE] Fed. Rep. of Germany ....... 3123019

[51] Int. Cl.³ .............................................. H02M 7/00
[52] U.S. Cl. ....................................... 363/68; 363/70; 363/144
[58] Field of Search ..................................... 363/67–70, 363/141, 144; 357/76, 77, 81; 307/252 L, 252 Q; 361/386, 388, 416

[56] References Cited

U.S. PATENT DOCUMENTS

| | | | |
|---|---|---|---|
| 3,573,569 | 4/1971 | Davis et al. | 357/76 X |
| 3,633,046 | 1/1972 | Dewey | 307/252 Q |
| 3,842,336 | 10/1974 | Galloway | 363/70 |
| 3,943,426 | 3/1976 | Thiele et al. | 336/175 |
| 4,090,233 | 5/1978 | Thiele et al. | 363/144 X |
| 4,161,016 | 7/1979 | Born et al. | 357/81 X |

OTHER PUBLICATIONS

Silizium Stromrichter Handbuch (BBC Silicon Converter Handbook, 1971, pp. 95 and 96.

Primary Examiner—Peter S. Wong
Attorney, Agent, or Firm—Kenyon & Kenyon

[57] ABSTRACT

A thyristor matrix arrangement having four columns, each column being formed of n thyristors connected in series with each other. In one embodiment, the series connected thyristors in respective columns are coupled to one another via heat sinks. The thyristors in each column are poled such that forward conduction current cannot flow through only one of the columns. The heat sinks are cross-connected among the columns to form a current path which is formed of appropriately poled thyristors in different ones of the columns and the column cross-connections. The cross-connections are inductive so as to provide relatively large inductive voltage drops when the thyristors are fired, thereby enabling the firing of thyristors having relatively low firing and forward voltages.

6 Claims, 4 Drawing Figures

THYRISTOR MATRIX HAVING AT LEAST FOUR COLUMNS

BACKGROUND OF THE INVENTION

This invention relates generally to thyristor maxtrix arrangements, and more particularly, to a thyristor matrix having at least four columns, each column having a plurality of thyristors connected in series, the series thyristors being connected to one another at junction points; selected ones of the junction points in different thyristor columns being connected to one another via cross-connections. The matrix conducts current in each of first and second conduction directions; equal numbers of thyristors being assigned to the conduction directions.

Columns of thyristors are known, for example, from U.S. Pat. No. 3,943,426. In this known arrangement, disc type thyristors are stacked upon each other and held resiliently together. A heat sink is inserted between two disc type thyristors and serves for conducting electric current. In order to handle large currents, several such columns can be connected in parallel. Moreover, in arrangements where conduction is desired in two directions, such thyristor columns can be arranged antiparallel. In one known arrangement, two columns of thyristors are connected in parallel with one another, and poled for conduction in a first direction, and two further columns of thyristors are also connected in parallel with one another, but are poled for conduction in the opposite direction. In this manner, a matrix having a total of four thyristor columns is produced. In order to ensure a uniform distribution of current in the known, commercially available, four-column thyristor equipment, all of the thyristors are connected to one another.

FIG. 1 shows a known thyristor matrix having four columns and two common terminals, A1 and A2. The known arrangement of FIG. 1 contains n thyristors in each column, the thyristors in the matrix being identified as T11 . . . , Tn1; T12 . . . , Tn2; T13 . . . , Tn3; and T14 . . . , Tn4. A plurality of heat sinks are each interconnected between two thyristors. The heat sinks are schematically indicated in FIG. 1, and designated with respective symbols K01 . . . , Kn4.

In this known arrangement, thyristor columns S1 and S2 are connected in parallel. Thyristor columns S3 and S4 are also connected in parallel with one another, but antiparallel to the combination of columns S1 and S2. Corresponding heat sinks K11 . . . , K14 are connected to one another, as are heat sinks K21 . . . , K24; and Kn1 . . . , Kn4. The heat sinks are connected to each other by means of cross-connections which are respectively identified as Q11 . . . , Qn3. Generally, the heat sinks identified as Kp1 . . . , Kp4, where p assumes the values one to n, are connected to each other. In this manner, the thyristors within the groups T11 . . . , T14 through Tn1 . . . , Tn4 are also connected to one another. All interrelated thyristors in the generalized group Tp1 . . . , Tp4, with their associated heat sinks Kp1 . . . , Kp4, of the four thyristor columns S1 to S4, shall be generally designated in the following discussion as level Ep of the thyristor arrangement. This known thyristor arrangement therefore comprises n levels E1 . . . , En.

Each of the levels E1 . . . , En of the thyristor arrangement is assigned one of common RC stages, R1, C1 . . . , Rn, Cn. The assigned RC stages are electrically disposed between the heat sinks of adjacent levels.

FIG. 2 is a schematic representation of the physical arrangement of the four thyristor columns S1 . . . , S4. The four thyristor columns are represented in this figure in a rectangular shape, the cross-connections being shown as leads. As a result of the physical configuration of the matrix, the distance between columns S1 and S3, or S2 and S4, is larger than the distance between adjacent columns. In addition, the cross-connections Q12 . . . , Qn2 are longer than the other cross-connections.

It is a problem with this known thyristor arrangement that the individual thyristors of the four columns, S1 . . . , S4, must be matched to each other in accordance with their respective dynamic forward characteristics. FIG. 3 shows a typical dynamic forward characteristic for heavy duty thyristors. As shown in FIG. 3, the curve of the thyristor current $i_t$ is a function of the anode-cathode voltage of the thyristor. Here, the firing voltage is designated as $V_Z$, and the forward voltage for the thyristor current, $i_D$, is designated with $V_D$. Such a characteristic may result in failure of the thyristors to fire simultaneously, because one of the parallel connected thyristors may have a lower firing voltage than the other thyristors. The early firing thyristor would prevent the remaining thyristors from firing, and thereby conduct the entire current so as to be overloaded. Thus, in order to ensure substantially simultaneous firing of all thyristors, they must be sorted and matched with respect to their firing voltages $V_Z$. In addition, the thyristors must also be sorted and matched with respect to their forward voltage $V_D$ because otherwise the parallel-connected thyristors would conduct unequal amounts of current. The requirement of sorting and matching thyristors with respect to two criteria presents major practical difficulties. Moreover, through aging or differences in the firing delay times, it may occur that only one of the thyristors fires while the remaining parallel-connected thyristors are below their firing voltages. In order to reliably exclude this possibility, transistors would have to be used for the parallel connections, because the firing voltages are lower than the forward voltages. The selection process, however, is quite expensive.

It is a further problem with the known thyristor arrangement that an uneven current distribution caused by a deviation in the characteristics of a thyristor is continued over the entire column. Although the connections between the thyristors through the heat sinks have very small inductances because of the small lengths of the connections, the longer cross-connections have more inductance so that equalization via the cross-connections does not occur, at least not over a short period of time, and the current distribution becomes increasingly worse.

It is known from *BBC Silicon Converter Handbook*, 1971, pages 95 and 96, that the current distribution among parallel-connected thyristors is improved by connecting an air-core choke in series with each individual thyristor of a parallel circuit. The effect of the air choke is that the thyristor which fires first will not take over the entire current immediately, and the voltage at the remaining thyristors increases because of the current change in the choke, so that the firing of the remaining thyristors is aided. However, such chokes for each individual thyristor not only increase the cost of the arrangement, but also the length because the chokes must be inserted between the thyristors and the heat sinks.

It is, therefore, an object of this invention to provide a thyristor arrangement wherein equalization of the firing times of, and the current distribution among, parallel-connected thyristors is achieved without the use of separate chokes.

SUMMARY OF THE INVENTION

The foregoing and other objects are achieved by this invention which provides at least four columns of n thyristors connected in series. The thyristors are connected to each other at respective junction points. In each column, the n thyristors therein are divided into sequential subgroups of p thyristors each, where p is a predetermined number having a value greater than zero. The p thyristors in each subgroup are connected in series and poled for normal forward conduction in the same direction as each other. Thus, each subgroup of p thyristors has a normal direction of conduction. Sequential ones of the subgroups, however, are poled for normal conduction in directions opposite to their adjacent subgroups. Each column, therefore, is formed of a sequence of thyristors and junction point; every $p^{th}$ junction point being a junction point where subgroups of thyristors are joined. The columns of thyristors are cross-connected to each other at the $p^{th}$ junction points. In this manner, the current flowing through the thyristor matrix must change columns. The thyristors are arranged such that current flowing in either direction through the thyristor matrix will flow through equal numbers of thyristors.

As indicated, current cannot flow only through an individual thyristor column, but must change from column to column. The current is therefore conducted through the cross-connections which have substantially more inductance than the connections within the thyristor columns. As each thyristor is switched on, an inductive voltage drop is produced at the cross-connections; the voltage drop maintaining the voltage across the thyristors which have not yet fired. The voltage is thus maintained for a certain period of time, thereby promoting the firing of the remaining thyristors. Moreover, a nonuniformity in the current distribution cannot continue itself over an entire thyristor column because of the change of the current flow between the thyristor columns. In addition, the static current distribution is improved, as in the known circuits where separate current distribution chokes are used. The advantages of the present invention are achieved without changing the physical design of the thyristor columns, and at no extra cost. Although the cross-connections must be designed to carry the full thyristor current, this will not require additional expense above the known arrangements because the known cross-connections carry the entire current when a thyristor fails.

It is a feature of the present invention that each heat sink is arranged in a column between two thyristors, thereby permitting the cross-connections to be designed as connecting corresponding heat sinks. Such a connection between the thyristors of the individual thyristor columns is simple and can be realized without separate contact elements.

The line length of the cross-connections is advantageously selected so that the inductive voltage drop at the cross-connections is larger, when the thyristor arrangement is switched on, than the maximum difference of the forward voltages and the firing voltages of the thyristors of the various thyristor columns connected to the cross-connections. This allows every thyristor to be fired reliably even if the firing voltage is higher than the forward voltage.

A common RC stage is shunted across the thyristors of all thyristor columns connected together via a cross-connection. This RC stage is arranged between the $p^{th}$ and the $(p+1)^{th}$ junction point of the thyristors of two different thyristor columns. As a result of such a connection, the discharge current of the RC stage flows, when the corresponding thyristors are switched on, along a relatively long connecting path so as to produce a relatively high inductive voltage drop which aids the firing of the unfired thyristors. The RC stage is advantageously connected across the contacts of the thyristors of the columns which have the longest line length of the cross-connections. This maximizes the inductive voltage drop.

In a further embodiment of the invention, a current sensor may be arranged in a cross-connection. The current sensor is connected so as to conduct only the equalization currents of the parallel circuits, thereby permitting measurement of possible misdistribution of the currents. Thus, only one current sensor for both directions is required for each parallel-connected pair of thyristors.

BRIEF DESCRIPTION OF THE DRAWINGS

Comprehension of the invention is facilitated by reading the following detailed description in conjunction with the annexed drawings, in which.

DETAILED DESCRIPTION

Figure 4:
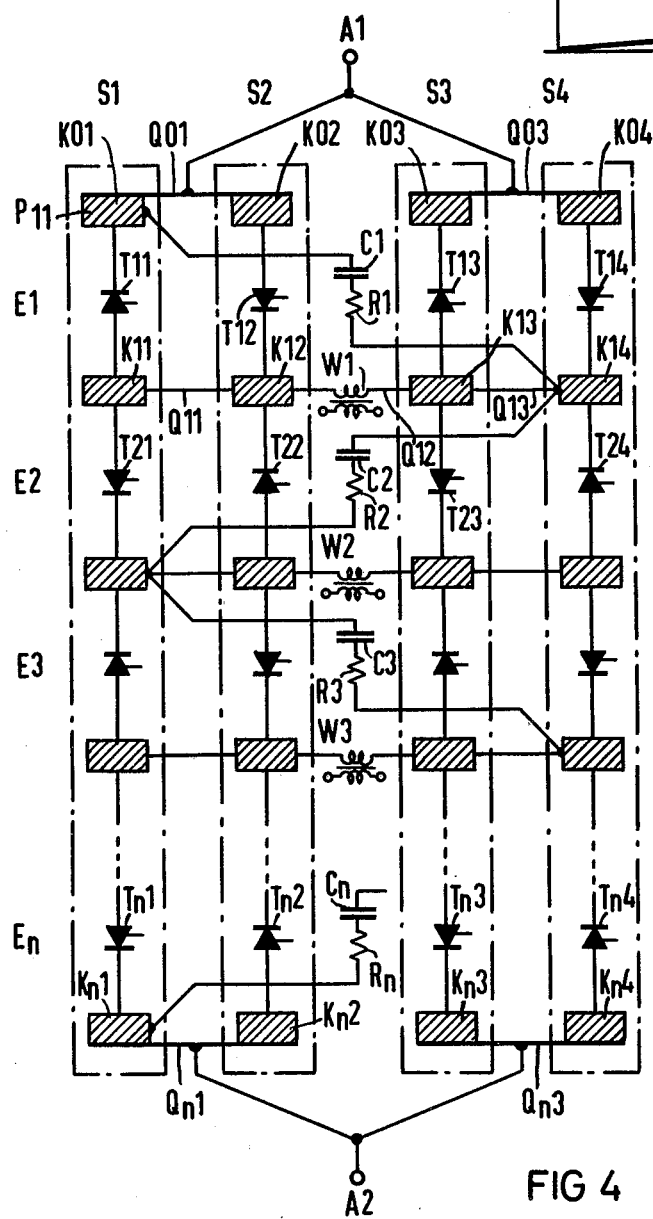
FIG. 4 is a schematic representation of a thyristor matrix constructed in accordance with the principles of the invention.

FIG. 4 shows a thyristor matrix arrangement according to the invention. The arrangement is formed of four thyristor columns, S1, S2, S3, and S4. Each column is provided with a plurality of disc-type thyristors T11..., Tn1; T12..., Tn2; T13..., Tn3; and T14..., Tn4. The thyristors are stacked on top of each other, and heat sinks K01 to Kn4 are inserted between respective thyristors. In addition to drawing off heat, the heat sinks form conductive connections between adjoining thyristors of a thyristor column. Thyristors T11, T12, T13, and T14, together with their associated heat sinks K11, K12, K13, and K14, form a level E1. Similarly, thyristors T21..., T24, and their associated heat sinks K21..., K24, form a second level, E2. In this specific illustrative embodiment, each column contains only one thyristor within each of levels E1..., En. The respective heat sinks of each level are electrically coupled to each other by respective cross-connections Q11..., Qn3. The first two heat sinks K01 and K02, of thyristor columns S1 and S2 are connected via cross-connection Q01; and the first two heat sinks K03 and K04 of thyristor columns S3 and S4, respectively, are connected by a cross-connection Q03. These two cross-connections, Q01 and Q03, are connected to a contact terminal A1. Similarly, the last heat sinks Kn1..., Kn4 are connected to a terminal A2.

The polarity of the thyristors T11..., Tn4 is selected so that at each heat sink K11..., Kn4, either the anodes or the cathodes of the two adjacent thyristors are connected. In this manner, the polarity of the thyristors change from level to level within each column S1..., S4. In this embodiment, the first thyristors of columns S1 and S3 are poled in the positive conduction direction, and the first thyristors of columns S2 and S4 are poled for conduction in the negative direction. Thus, each cross-connection Q11..., Qn3 connects a heat sink with an anode terminal and a heat sink with a cathode terminal. No current flow is therefore possible within an individual thyristor column S1..., S4. In addition, in this embodiment, the polarity of each thyristor T11..., T14 alternates within each level E1..., En from thyristor column S1 to thyristor column S4. In this thyristor arrangement, current flow is therefore possible only through the cross-connections Q11..., Qn4. A current from terminal A1 to terminal A2 will therefore flow, for example, via the heat sink K02, the thyristor T12, the heat sink K12, the cross-connection Q11, the heat sink K11, the thyristor T21, etc. A parallel current also flows via heat sink K04, the thyristor T14, the heat sink K14, the cross-connection Q13, the heat sink K13, the thyristor T23, etc. A current in the reverse direction flows via the thyristor T22, the cross-connection Q11, and the thyristor T11, and a parallel current flows via thyristor T24, the cross-connection Q13, and the thyristor T13.

If, for example, the current path should be fired first via thyristors T12 and T21, an inductive voltage drop is produced at the connecting lines, specifically at the cross-connections Q01 and Q11. This voltage drop is added to the forward voltage of thyristors T12 and T21. Thus, a voltage higher than the forward voltage of the thyristors T12 and T21 is present at the yet to be fired parallel-connected thyristors T14 and T23. This higher voltage aids in the firing of thyristors T14 and T23. In this manner, the firing of all parallel-connected thyristors is assured, even thyristors which have a lower forward voltage than the firing voltage, if the inductive voltage drop at the cross-connections compensates for the difference between the forward voltage of the first-ignited thyristor and the possibly higher firing voltage of the unfired thyristors.

The voltage distribution among the thyristors in the forward state is improved by the inductance of the connecting lines. The inductances of the cross-connections counteract an increase of the current flowing through the respective branches, while on the other hand, the voltages present at the remaining thyristors are increased by the inductive voltage drop in the event of a current increase. Thus, the current consumption for these thyristors is again aided. In sum, the inductances of the cross-connections have an effect which is similar to that of the known current distribution chokes in the sense of equalizing the current distribution.

As noted, unlike the known arrangement, the change of current from one thyristor column to another prevents a misdistribution of current which is produced in one level from continuing through the entire thyristor column.

Figure 1:
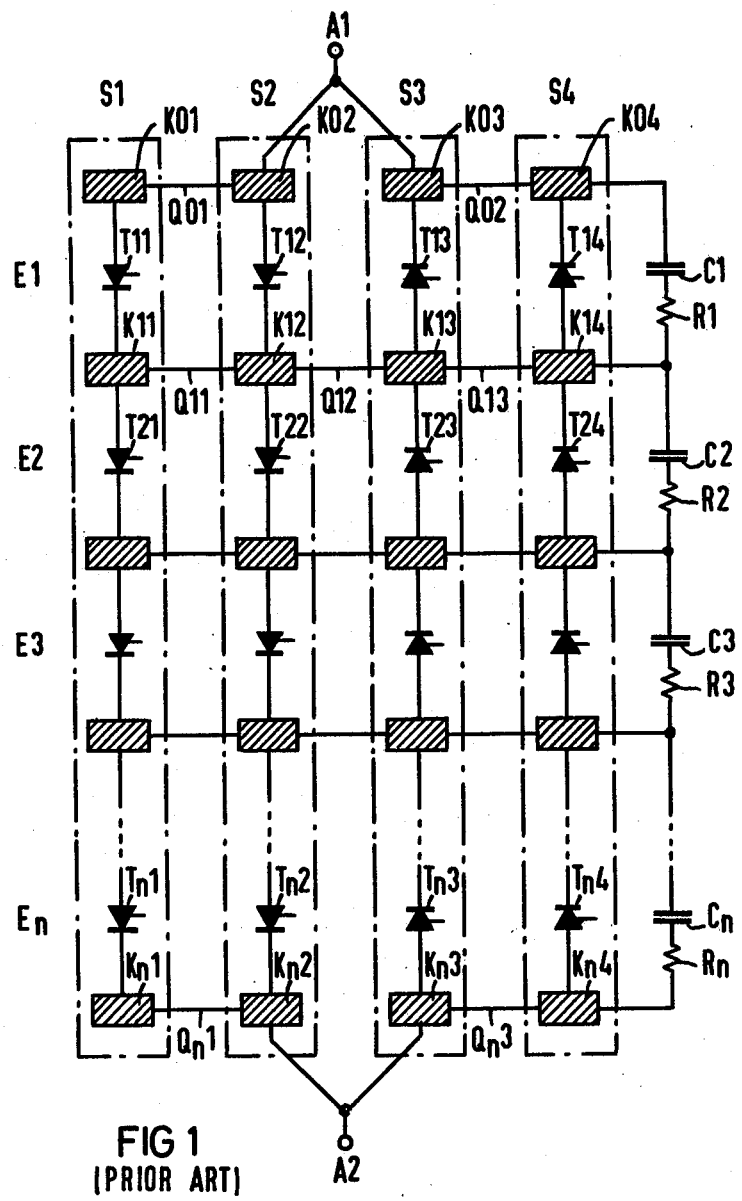
FIG. 1 is a schematic representation of a prior art thyristor matrix.
Figure 2:
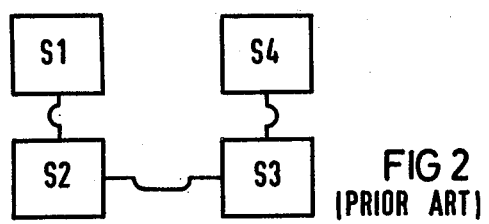
FIG. 2 is a block and line representation of the prior art circuit of FIG. 1.
Figure 3:
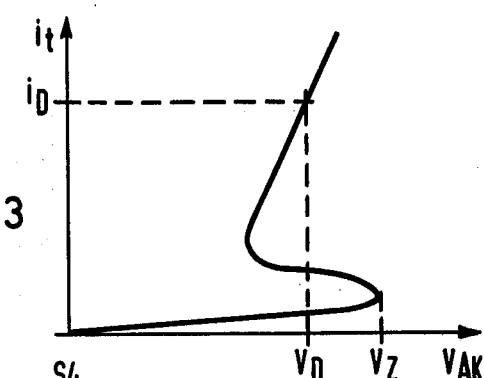
FIG. 3 is a graph showing the characteristics of a thyristor.

A comparison of FIG. 1, which was discussed hereinabove, with FIG. 4, shows that the advantages of the present invention are achieved without changing the column design. In the embodiment of FIG. 4, merely the polarity of every other thyristor of a thyristor column is reversed. Thus, no further changes are necessary in the known thyristor columns, and no additional effort or expense is required.

In another aspect of the inventive thyristor arrangement according to FIG. 4, a respective RC stage of the group, C1, R1..., CnRn, is assigned to each of the levels E1..., En. Each RC stage is connected between a heat sink of thyristor column S1, and a heat sink of thyristor column S4 on the following level. The discharge current from the capacitor, which flows when a thyristor of the level is switched-on, flows independently of the thyristor which is switched-on, and always through three cross-connections. This discharge current has a steep initial slope thereby causing a relatively large inductive voltage drop which aids in firing of the unfired thyristors. This voltage drop is independent of the initial rising slope of the main current.

The current flowing through the cross-connections in the inventive thyristor arrangement enable a simple detection of a faulty current distribution of a current flowing through the thyristors. All equalization currents between the parallel-connected thyristors flow via the cross-connections Q12..., Q(n−1)2 between the thyristor columns S2 and S3 for both current directions. As mentioned, these cross-connections are relatively long, and therefore the necessary current transformers W1..., Wn−1 can be accommodated without problem. In the known thyristor arrangement according to FIG. 1, the current sensors for determining the faulty current distribution must be accommodated separately for each current direction between the thyristor columns S1 and S2, and respectively, between the thyristors columns S3 and S4. The sensors in the known arrangement can be accommodated only with difficulty because of the small spacing of the thyristor columns.

Although the invention has been disclosed in terms of specific embodiments and applications, persons skilled in the art can produce additional embodiments, in light of this teaching, without departing from the spirit or exceeding the scope of the claimed invention. Accordingly, it is to be understood that the drawings and descriptions in this disclosure are proffered as illustrative to facilitate comprehension of the invention, and should not be construed to limit the scope thereof.

What is claimed is:

1. A thyristor matrix arrangement of the type having at least four columns, each of the columns being formed of n thyristors connected in series with each other, each of the thyristors having a cathode electrode and an anode electrode, the thyristor matrix arrangement further comprising:

a plurality of junction means in each column, each of said junction means serially interconnecting an associated two of the thyristors at selectable similar ones of their respective cathode and anode electrodes, consecutive pairs of said junction means in each column having a predetermined number of the thyristors connected in series therebetween, said predetermined number of the series thyristors having a predetermined overall forward conduction direction to form a respective interjunction current path between each of said respective consecutive pairs of said junction means; and cross-connection means coupling corresponding ones of said junction means in different ones of the columns for forming at least one primary current path through the thyristor matrix arrangement, said primary current path being formed of the series combination of selected ones of said interjunction current paths from different ones of the columns, and said cross-connection means.

2. The thyristor matrix arrangement of claim 1 wherein there are further provided a plurality of heat sink means, each for electrically connecting adjacent ones of the thyristors, and forming said junction means, said cross-connection means coupling corresponding ones of said heat sink means.

3. The thyristor matrix arrangement of claim 1 or 2 wherein said thyristors have respective forward and firing voltages, and said cross-connection means comprises a plurality of inductive lines each having a predetermined line length for producing an inductive voltage drop which is greater than the largest difference between the forward and firing voltages of the thyristors connected to said cross-connection means of the different thyristor columns.

4. The thyristor matrix arrangement of claim 3 wherein there are further provided RC stage means for shunting said interjunction current paths, said RC stage means having first and second terminals connected to respective junction means of different columns.

5. The thyristor matrix arrangement of claim 4 wherein said respective junction means where said first and second terminals of said RC stage means are connected are arranged in respective columns which are connected by selected ones of said inductive lines having long predetermined line lengths.

6. The thyristor matrix arrangement of claim 1 wherein there is further provided at least one current sensor means arranged in said cross-connection means for detecting improper current distribution.

* * * * *